United States Patent [19]
Bliss

[11] Patent Number: 5,753,929
[45] Date of Patent: May 19, 1998

[54] MULTI-DIRECTIONAL OPTOCOUPLER AND METHOD OF MANUFACTURE

[75] Inventor: John Bliss, Tempe, Ariz.

[73] Assignee: Motorola, Inc., Schaumburg, Ill.

[21] Appl. No.: 697,709

[22] Filed: Aug. 28, 1996

[51] Int. Cl.[6] .................................................. G02B 27/00
[52] U.S. Cl. .................................. 250/551; 327/514
[58] Field of Search ........................... 250/239, 551; 327/514; 257/82, 626

[56] References Cited

U.S. PATENT DOCUMENTS

| | | |
|---|---|---|
| 4,271,365 | 6/1981 | Adams . |
| 4,282,604 | 8/1981 | Jefferson ........................... 250/551 |
| 4,450,461 | 5/1984 | Cook et al. . |
| 4,472,020 | 9/1984 | Evanchuk . |
| 4,794,431 | 12/1988 | Park ................................. 250/551 |
| 4,901,329 | 2/1990 | Leas . |
| 5,393,989 | 2/1995 | Gempe et al. ..................... 327/514 |

OTHER PUBLICATIONS

Siemens—Optoectronics Data Book—1995•1996, "ILD214—Dual Phototransistor Small Outline Surface Mount Optocoupler", Preliminary Data Sheet, Jul. 1996, pp. 5–162 and 5–163.
CP Clare Corporation, Product Outline—Fourth Edition Rev. A, Solid State Products, LOC Series Application Note, 1993, p. 5.

*Primary Examiner*—Stephone B. Allen
*Attorney, Agent, or Firm*—George C. Chen

[57] ABSTRACT

A multi-directional optocoupler includes an assembly substrate (11), an emitter (20) coupled to a first region of the assembly substrate (11), a different emitter (21) coupled to a second region of the assembly substrate (11), a detector (23) coupled to a third region of the assembly substrate (11), a different detector (22) coupled to a fourth region of the assembly substrate (11), a light transmissive region (24) coupling the emitter (20) and the detector (23) wherein the emitter (20) and the detector (23) are configured to transmit and receive a first signal in a direction (26), and a different light transmissive region (25) coupling the different emitter (21) and the different detector (22) wherein the different emitter (21) and the different detector (22) are configured to transmit and receive a second signal in a different direction (27).

18 Claims, 5 Drawing Sheets

MULTI-DIRECTIONAL OPTOCOUPLER AND METHOD OF MANUFACTURE

BACKGROUND OF THE INVENTION

This invention relates, in general, to optical electronic components, and more particularly, to optocouplers.

Voltage isolation is often required between different portions of an electronic system. Typically, a microcontroller and a plurality of opto-isolators or optocouplers are used to provide the voltage isolation wherein each of the opto-isolators or optocouplers has a single optical channel or path. However, an expensive and complex multi-layer metallization system is required to electrically couple the plurality of optocouplers to the microcontroller. Furthermore, the use of the plurality of optocouplers increases the size of the assembly board on which the electronic system is mounted.

To reduce the size of the assembly board and the electronic system, the plurality of single channel optocouplers can be replaced by a single optocoupler that has a plurality of optical channels that conduct light signals in a single direction. However, the expensive and complex multi-layer metallization system is still needed to electrically couple the single optocoupler to the microcontroller.

Accordingly, a need exists for an optocoupler that eliminates the requirement for an expensive and complex multi-layer metallization system. The optocoupler should be cost-effective, and the manufacturing process for the optocoupler should be compatible with existing optocoupler fabrication techniques.

DETAILED DESCRIPTION OF THE DRAWINGS

Figure 1:
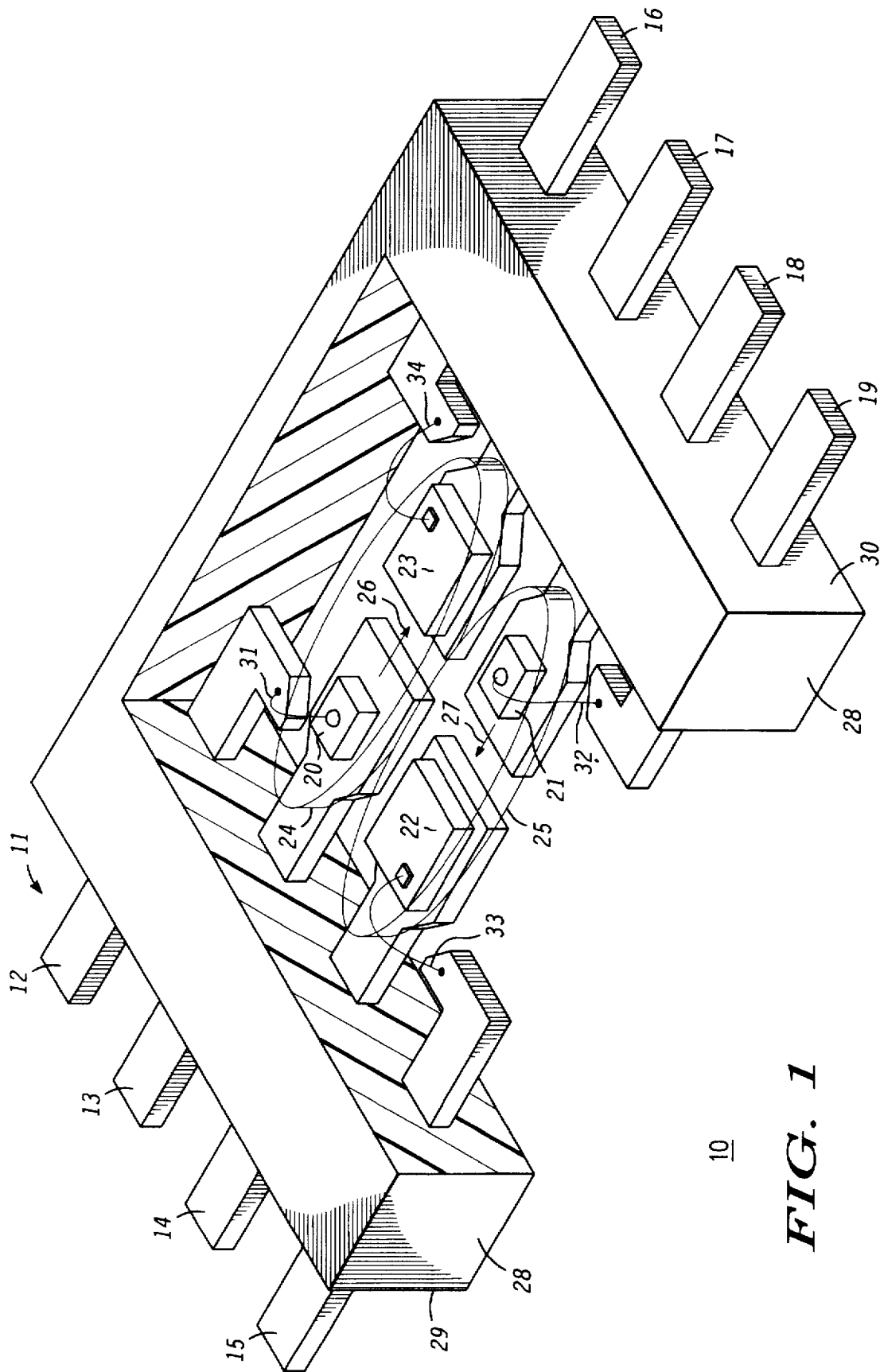
FIG. 1 illustrates an isometric view of an embodiment of an electronic component in accordance with the present invention.

FIG. 1 illustrates an isometric view of an electronic component 10. Component 10 represents a light coupling component or device such as, for example, an optocoupler or opto-isolator. Component 10 can be referred to as a multi-directional optocoupler because component 10 can simultaneously conduct a plurality of light signals in a plurality of different directions, which will be explained in more detail hereinafter. As used herein, the term "light" includes wavelengths of light that are visible to human beings as well as other wavelengths of light to which semiconductor materials can be made sensitive.

Component 10 includes an assembly substrate 11. In the FIG. 1, substrate 11 is depicted as a semiconductor leadframe to simplify the explanation of component 10. However, it is understood that other types of assembly substrates including, but not limited to, ball grid arrays or the like can be used for substrate 11. Substrate 11 has a plurality of electrical leads 12, 13, 14, 15, 16, 17, 18, and 19 that can be electrically isolated from each other. Although substrate 11 is portrayed to have eight leads, it is understood that substrate 11 can have any appropriate number of leads. For component 10, leads 12, 13, 14, and 15 comprise a set of leads that are planar, substantially parallel, and adjacent to each other. Additionally, leads 16, 17, 18, and 19 of component 10 comprise another set of leads that are also planar, substantially parallel, and adjacent to each other. Furthermore, the two sets of leads are symmetrical with each other, are substantially coplanar with each other, are opposite each other, and are at opposite ends of component 10. It is understood that leads 12, 13, 14, 15, 16, 17, 18, and 19 can be bent to form a surface mount or other desired configuration during subsequent manufacturing steps.

Light emitting devices or transmitters 20 and 21 are electrically coupled to and are mounted on interior portions or regions of leads 13 and 18, respectively. As illustrated in FIG. 1, the interior portions of leads 13 and 18 are symmetrical to each other and are wider than the exterior portions or distal ends of leads 13 and 18. Wire bonds 31 and 32 electrically couple transmitters 20 and 21 to leads 12 and 19, respectively. Transmitters 20 and 21 can be any light emitting devices known in the art such as, for example, light emitting diodes (LEDs), vertical cavity surface emitting lasers (VCSELs), or the like. Accordingly, the depicted structures in FIG. 1 are only for the purpose of illustrating transmitters 20 and 21. Transmitters 20 and 21 can be similar or different from each other.

Light detecting devices or receivers 22 and 23 are mounted on and are electrically coupled to interior regions or portions of leads 14 and 17, respectively. As illustrated in FIG. 1, the interior regions of leads 14 and 17 are symmetrical to each other and are wider than the distal ends or exterior portions of leads 14 and 17. Wire bonds 33 and 34 electrically couple receivers 22 and 23 to leads 15 and 16, respectively. Receivers 22 and 23 can be any light detecting devices known in the art including, but not limited to, photodetectors and photosensitive insulated-gate-bipolar transistors. Accordingly, the depicted structures in FIG. 1 are only for the purpose of illustrating receivers 22 and 23. Receivers 22 and 23 can be different or similar to each other.

A light transmissive region 24 can be molded to encapsulate and optically couple transmitter 20 and receiver 23. Region 24 should be electrically insulative to electrically isolate transmitter 20 and receiver 23 and to electrically isolate leads 13 and 17. Transmitter 20 and receiver 23 are configured within region 24 so that transmitter 20 is capable of generating a light signal that travels in a direction 26 through region 24 and towards receiver 23. Region 24 should be capable of conducting or transmitting the light signal without significantly attenuating the intensity of the light signal. As an example, region 24 can be comprised of a clear silicon die coat or gel, a clear epoxy, a glass material, or the like.

Similar to region 24, a light transmissive region 25 can be molded to encapsulate, optically couple, and electrically isolate transmitter 21 and receiver 22. However, transmitter 21 and receiver 22 are configured within region 25 so that transmitter 21 is capable of generating a different light signal in a different direction 27 through region 25 and towards receiver 22. As illustrated in FIG. 1, direction 27 is opposite and parallel to direction 26. These plurality of different directions provide the multi-directional attributes of component 10. The light signals from transmitters 20 and 21 can be generated and transmitted simultaneously without interfering with each other. Region 25 preferably has a similar composition and is preferably molded simultaneously with region 24 to facilitate the manufacturing of component 10.

An encapsulant or packaging material 28 can be molded to be located around or to encapsulate regions 24 and 25, transmitters 20 and 21, receivers 22 and 23, and the interior portions of leads 12, 13, 14, 15, 16, 17, 18, and 19. A central portion of material 28 is removed to facilitate the explanation of component 10. As illustrated in FIG. 1, material 28 has opposites sides 29 and 30. Leads 12, 13, 14, and 15 extend from side 29, and leads 16, 17, 18, and 19 extend from side 30. Material 28 is preferably electrically insulative to provide electrical isolation between each of leads 12, 13, 14, 15, 16, 17, 18, and 19. Material 28 is also preferably optically insulative so that light generated by transmitters 20 and 21 is kept within regions 24 and 25, respectively. Similarly, material 28 should keep light generated outside component 10 from penetrating into regions 24 and 25 and interfering with the light signals generated by transmitters 20 and 21. As an example, material 28 can be comprised of a conventional opaque silica-based molding compound or the like.

Figure 2:
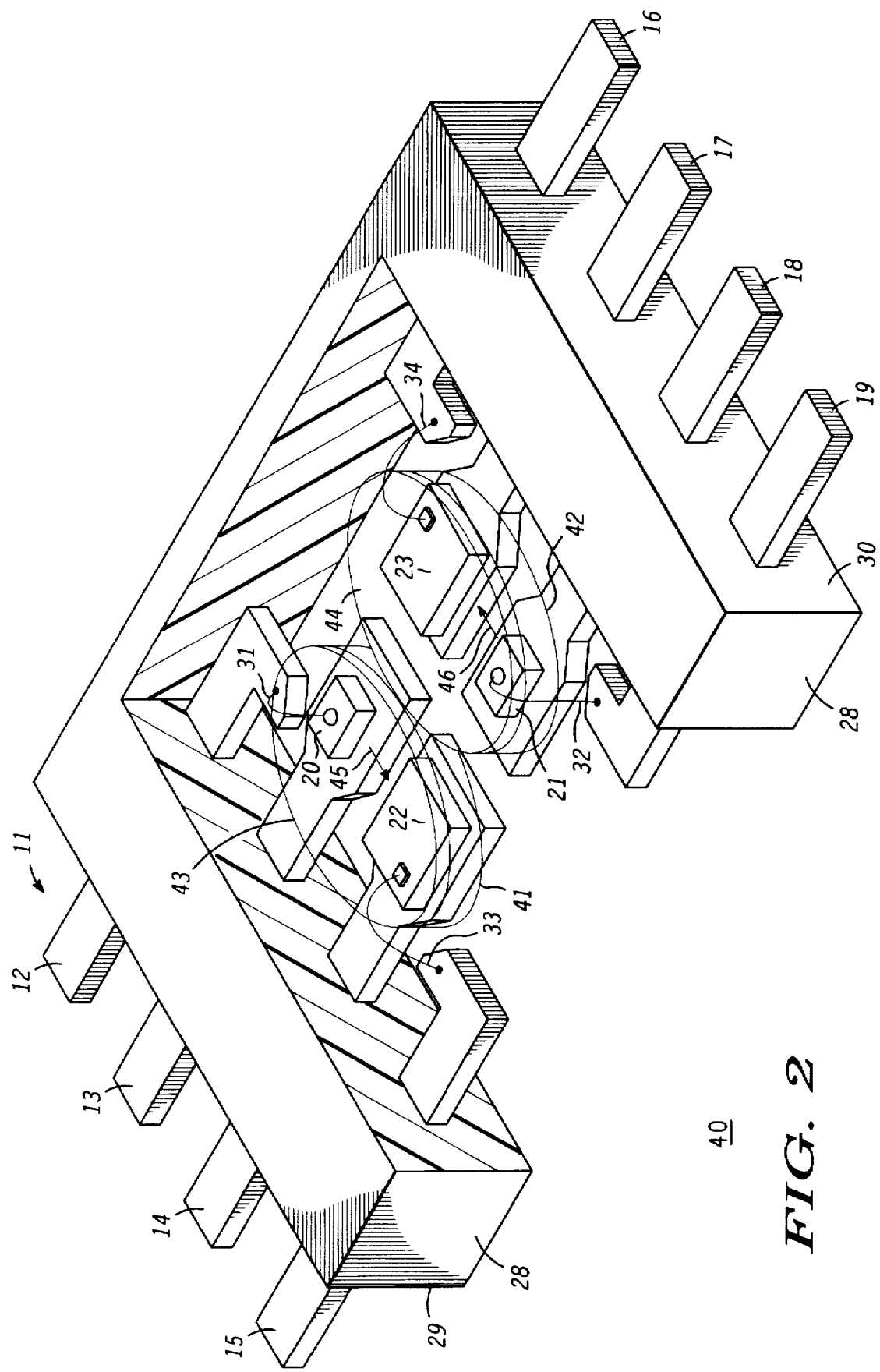
FIG. 2 portrays an isometric view of an alternative embodiment of the electronic component of FIG. 1 in accordance with the present invention.

FIG. 2 portrays an isometric view of an electronic component 40, which is an alternative embodiment of component 10 of FIG. 1. Elements of FIG. 2 that have the same reference numerals as FIG. 1 are the same as the corresponding FIG. 1 elements. Similar to component 10, component 40 includes assembly substrate 11, transmitters 20 and 21, receivers 22 and 23, and packaging material 28. However, unlike component 10, leads 12, 13, 16, and 17 form a set of leads for component 40, and leads 14, 15, 18, and 19 form another set of leads for component 40. Therefore, portions of each of the two sets of leads in component 40 extend from both of sides 29 and 30.

Furthermore, component 40 includes light transmissive regions 41 and 42, which are used in place of regions 24 and 25 of component 10. Region 41 encapsulates transmitter 20 and receiver 22, which are configured so that transmitter 20 is capable of transmitting a light signal in a direction 45 towards receiver 22. Region 42 encapsulates transmitter 21 and receiver 23, which are configured so that transmitter 21 is capable of transmitting a different light signal in a different direction 46 towards receiver 23. Direction 46 within region 42 is opposite and parallel to direction 45 within region 41. Regions 41 and 42 can be comprised of materials that are similar to those used for regions 24 and 25.

It is understood that the embodiment of component 10 in FIG. 1 is preferred over the embodiment of component 40 in FIG. 2 because component 10 provides a wider or larger separation between the leads of the paired transmitters and receivers. For example, transmitter leads 12 and 13 of component 10 are separated further from receiver leads 16 and 17 of component 10 compared to transmitter leads 12 and 13 of component 40 and receiver leads 14 and 15 of component 40. Thus, the wider lead separation of component 10 compared to component 40 provides a desirable higher voltage isolation for component 10 compared to component 40.

Component 40 also has reflective layers 43 and 44 that overlie regions 41 and 42, respectively, and that are also covered by material 28. Layers 43 and 44 can be comprised of any suitable reflective material including, but not limited to, a hologram, a mirror, a metal, or a dielectric or non-dielectric material that has a refractive index that is less than a refractive index of regions 41 or 42. In an alternative embodiment, layers 43 and 44 completely surround or encapsulate all exterior surfaces of regions 41 and 42. In yet another alternative embodiment, a single reflective layer can extend over both regions 41 and 42.

Figure 3:
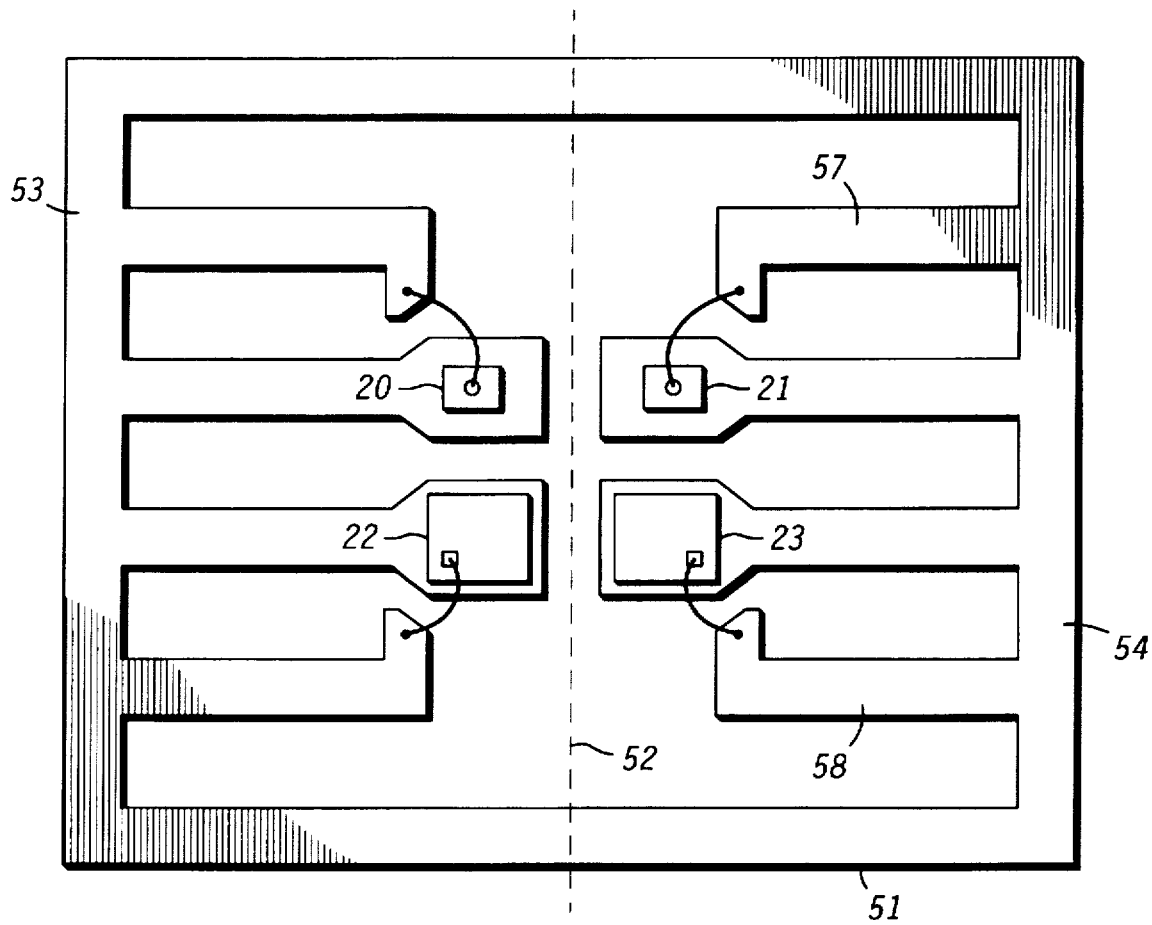
FIG. 3 represents a plan view and FIG. 4 represents an isometric view of another alternative embodiment of the electronic component of FIG. 1 during manufacturing and in accordance with the present invention.
Figure 4:
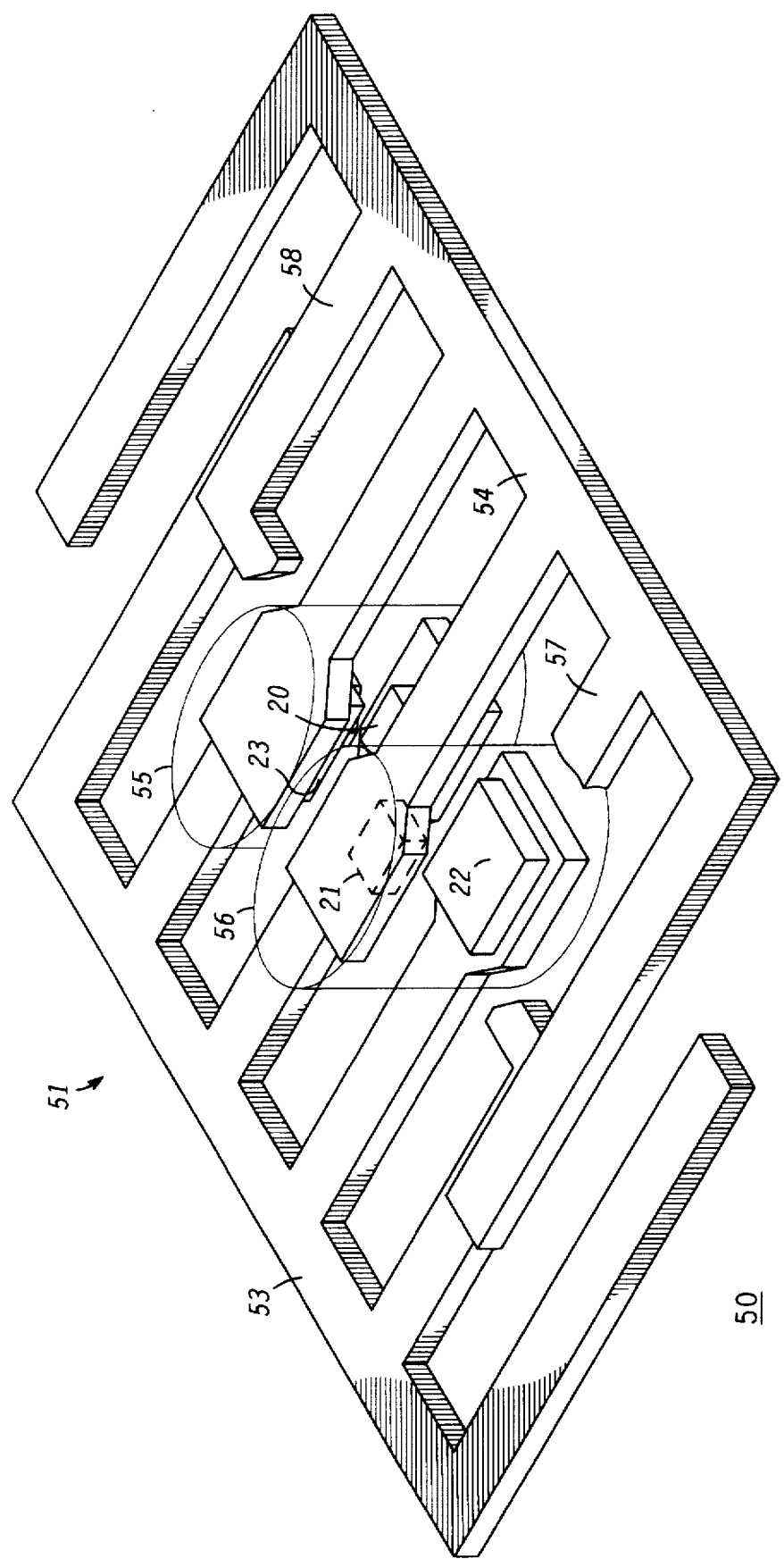

FIG. 3 represents a plan view and FIG. 4 represents an isometric view of an electronic component 50 during manufacturing. Component 50 is another alternative embodiment of component 10 of FIG. 1. It is understood that the same reference numerals are used in the figures to denote the same elements. Component 50 includes a leadframe 51 that has symmetric and coplanar portions 53 and 54. Transmitter 20 and receiver 22 are mounted over adjacent leads of portion 53, and transmitter 21 and receiver 23 are mounted over adjacent leads of portion 54. In FIG. 3, the leads supporting transmitters 20 and 21 are opposite each other, and the leads supporting receivers 22 and 23 are also opposite each other. Portion 54 has leads 57 and 58, which are electrically coupled to transmitter 21 and receiver 23, respectively. Leadframe 51 is subsequently cut in half to separate portions 53 and 54.

In FIG. 4, separated portion 54 is positioned or aligned over portion 53 wherein portions 53 and 54 are opposite and substantially parallel to each other. More specifically, portion 54 is turned upside-down wherein receiver 23 overlies transmitter 20, which form a first pair, and wherein transmitter 21 overlies receiver 22, which form a second pair. The two pairs of transmitters and receivers in component 50 are configured to provide multi-directional light paths or channels. A portion of lead 57 is removed from FIG. 4 to facilitate the explanation of component 50.

FIG. 4 portrays light transmissive regions 55 and 56, which can be similar to regions 24 or 25 of FIG. 1 or regions 41 or 42 of FIG. 2. As illustrated in FIG. 4, regions 55 and 56 can extend below portion 53 and above portion 54 of leadframe 51. Alternatively, the top and bottom surfaces of regions 55 and 56 can be coplanar with portions 53 and 54 of leadframe 51. It is understood that a packaging material similar to material 28 of FIGS. 1 and 2 can be used to encapsulate regions 55 and 56 during subsequent manufacturing steps. Furthermore, the dam bars of leadframe 51 will be excised, and the leads of leadframe 51 can be trimmed and bent.

Figure 5:
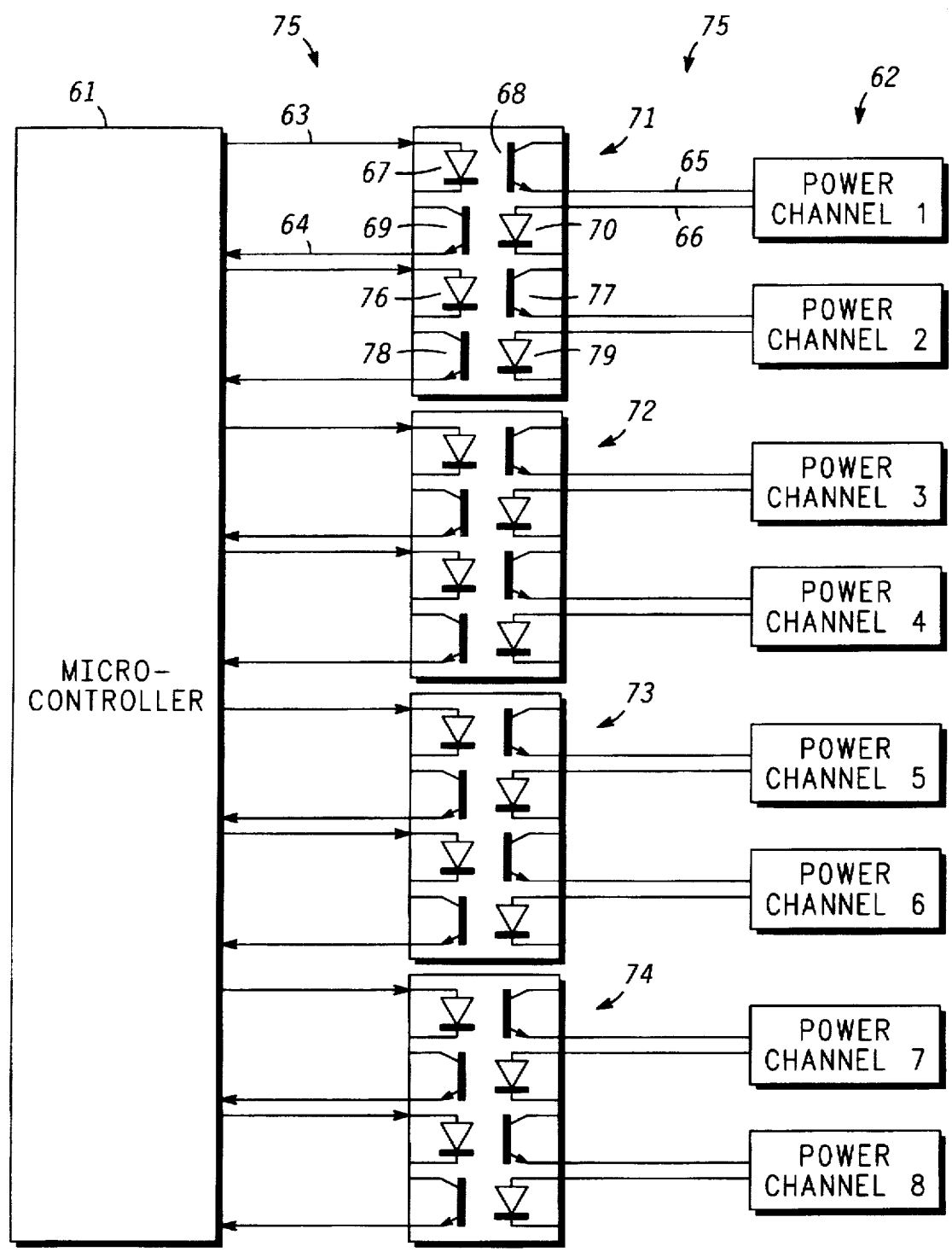
FIG. 5 depicts a partial schematic view of an electronic system that uses a plurality of the electronic components in accordance with the present invention.

FIG. 5 depicts a partial schematic view of an electronic system 60 that uses a plurality of optocouplers 71, 72, 73, and 74. System 60 also has a control chip or microcontroller 61, a power supply 62, and an interconnect system 75 that electrically couples optocouplers 71, 72, 73, and 74 to microcontroller 61 and power supply 62. Each of optocouplers 71, 72, 73, and 74 can be similar to component 10 of FIG. 1. For example, optocoupler 71 can have a plurality of light emitting devices 67, 70, 76, and 79, each of which can be similar to transmitters 20 or 21 of component 10. Furthermore, optocoupler 71 can also have a plurality of light detecting devices 68, 69, 77, and 78, each of which can be similar to receivers 22 or 23 of component 10. Devices 67, 69, 76, and 78 are located on one side of optocoupler 71, and devices 68, 70, 77, and 79 are located on an opposite side of optocoupler 71. Optocouplers 72, 73, and 74 are similar to optocoupler 71.

The devices within optocoupler 71 are configured to provide multi-directional light paths wherein devices 67 and 68 provide a light path in a first direction and wherein devices 70 and 69 provide a different light path in a second direction. Devices 76 and 77 are configured similarly to devices 67 and 68 to provide a second light path in the first direction, and devices 79 and 78 are configured similarly to devices 70 and 69 to provide a second light path in the second direction. Therefore, optocoupler 71 is a multi-channel device having a plurality of light paths or optical channels in a plurality of directions. The four channels of optocoupler 71 enable a smaller system 60 compared to a system using four separate optocouplers that each have a single optical channel. It is understood that optocoupler 71 is not restricted to having only four multi-directional light paths. For instance, in an alternative embodiment, optocoupler 71 can have eleven or any desired number of light paths.

The multi-directional functionality and the multi-channel capabilities of optocouplers 71, 72, 73, and 74 enable the simplification of interconnect system 75 and also enable the size reduction for system 60. In the prior art, multi-channel optocouplers are not multi-directional because the prior art optocouplers only have a single direction of light conduction. Therefore, the use of prior art multi-channel optocouplers requires the use of crossovers in an interconnect system that has a plurality of levels of interconnect. As known in the art, a crossover occurs where one interconnect line crosses over an another interconnect line. However, interconnect system 75 does not need a crossover because of the multi-directional functionality of optocouplers 71, 72, 73, and 74. Furthermore, system 75 can consist only of a single level of interconnect because a crossover is not required. Therefore, system 75 is less expensive and easier to manufacture compared to the required interconnect systems of the prior art.

Therefore, it is apparent there has been provided an improved optocoupler that overcomes the disadvantages of the prior art. The present optocoupler has a plurality of light paths in a plurality of directions. The optocoupler described herein eliminates the requirement for an expensive and complex multi-layer metallization system. Furthermore, the present optocoupler is also cost-effective because the manufacturing process for the optocoupler is compatible with existing optocoupler fabrication techniques.

While the invention has been particularly shown and described with reference to preferred embodiments, it will be understood by those skilled in the art that changes in form and detail may be made without departing from the spirit and scope of the invention. For instance, the numerous details set forth herein such as, for example, the specific composition of regions 24 and 25 (FIG. 1) are provided to facilitate the understanding of the present invention and are not provided to limit the scope of the invention. Furthermore, it is understood that the plurality of light paths in a single optocoupler do not have to be parallel to each other. Additionally, it is also understood that the plurality of light paths in a single optocoupler can have more than two directions. For example, an optocoupler can have three light paths that are perpendicular to each other and that are similar to X, Y, and Z axes of a Cartesian coordinate system. Accordingly, the disclosure of the present invention is not intended to be limiting. Instead, the disclosure of the present invention is intended to be illustrative of the scope of the invention, which is set forth in the following claims.

I claim:

1. A multi-directional optocoupler comprising:

an assembly substrate having a first region, a second region, a third region, and a fourth region electrically isolated from each other;

a first emitter coupled to the first region;

a second emitter coupled to the second region;

a first detector coupled to the third region;

a second detector coupled to the fourth region;

a first light transmissive region coupling the first emitter and the first detector, the first emitter and the first detector configured to transmit and receive a first signal in a first direction; and a second light transmissive region coupling the second emitter and the second detector, the second emitter and the second detector configured to transmit and receive a second signal in a second direction different from the first direction;

wherein the assembly substrate is a leadframe and wherein the first and fourth regions of the assembly substrate comprise a first set of leads and wherein the second and third regions of the assembly substrate comprise a second set of leads wherein the first set of leads is opposite and symmetric to the second set of leads.

2. The multi-directional optocoupler of claim 1 further comprising an encapsulating material located around the first and second light transmissive regions wherein the encapsulating material optically insulates the first and second light transmissive regions from each other and wherein the encapsulating material optically insulates the first and second light transmissive regions from light generated outside of the first and second light transmissive regions.

3. The multi-directional optocoupler of claim 1 wherein the first and second directions are opposite and parallel to each other.

4. The multi-directional optocoupler of claim 1 wherein the first and fourth regions are coplanar and wherein the second and third regions are coplanar and wherein the first and fourth regions are parallel to the second and third regions.

5. The multi-directional optocoupler of claim 4 wherein the second and third regions overlie the first and fourth regions.

6. The multi-directional optocoupler of claim 4 wherein the first and fourth regions are coplanar with the second and third regions.

7. The multi-directional optocoupler of claim 1 further comprising a reflective layer overlying the first and second light transmissive regions.

8. An electronic component comprising:

a leadframe having a first set of leads and a second set of leads, each of the first and second sets of leads having a first portion and a second portion;

a first light emitting device coupled to the first portion of the first set of leads;

a second light emitting device coupled to the first portion of the second set of leads;

a first light detecting device coupled to the second portion of the first set of leads;

a second light detecting device coupled to the second portion of the second set of leads;

a first electrically insulative region encapsulating the first light emitting device and the second light detecting device;

a second electrically insulative region encapsulating the second light emitting device and the first light detecting device; and a packaging material encapsulating the first and second electrically insulative regions.

9. The electronic component of claim 8 wherein the packaging material optically isolates the first electrically insulative region from the second electrically insulative region.

10. The electronic component of claim 8 wherein the first light emitting device transmits a first light signal in a first direction towards the second light detecting device and wherein the second light emitting device transmits a second light signal in a second direction towards the first light detecting device wherein the second direction is opposite the first direction.

11. The electronic component of claim 10 wherein the first and second light signals are transmitted simultaneously.

12. The electronic component of claim 8 wherein the packaging material has a first side and a second side opposite the first side and wherein the first portion of the first set of leads extends from the first side and wherein the second portion of the first set of leads extends from the second side and wherein the first portion of the second set of leads extends from the second side and wherein the second portion of the second set of leads extends from the first side.

13. The electronic component of claim 8 wherein the packaging material has a first side and a second side opposite the first side and wherein the first set of leads extend from the first side and wherein the second set of leads extend from the second side.

14. The electronic component of claim 8 wherein the first and second portions of the first set of leads are substantially planar with the first and second portions of the second set of leads.

15. The electronic component of claim 8 wherein the first and second portions of the first set of leads overlie the first and second portions of the second set of leads.

16. The electronic component of claim 8 further comprising:
   a microcontroller; and
   an interconnect system electrically coupling the microcontroller and the leadframe wherein the interconnect system is devoid of a crossover.

17. A method manufacturing a light coupling component comprising:
   providing a leadframe having a plurality of leads;
   coupling a first light transmitter to a first one of the plurality of leads;
   coupling a second light transmitter to a second one of the plurality of leads;
   coupling a first light receiver to a third one of the plurality of leads;
   coupling a second light receiver to a fourth one of the plurality of leads;
   coupling the first light transmitter and the first light receiver wherein the first light transmitter is capable of transmitting light in a first direction towards the first light receiver; and
   coupling the second light transmitter and the second light receiver wherein the second light transmitter is capable of transmitting light in a second direction towards the second light receiver wherein the second direction is different from the first direction;
   wherein the step of providing the leadframe comprises:
      providing the first one of the plurality of leads adjacent to the third one of the plurality of leads and opposite to the fourth one of the plurality of leads; and
      providing the second one of the plurality of leads adjacent to the fourth one of the plurality of leads and opposite the third one of the plurality of leads.

18. A method manufacturing a light coupling component comprising:
   providing a leadframe having a plurality of leads;
   coupling a first light transmitter to a first one of the plurality of leads;
   coupling a second light transmitter to a second one of the plurality of leads;
   coupling a first light receiver to a third one of the plurality of leads;
   coupling a second light receiver to a fourth one of the plurality of leads;
   coupling the first light transmitter and the first light receiver wherein the first light transmitter is capable of transmitting light in a first direction towards the first light receiver; and
   coupling the second light transmitter and the second light receiver wherein the second light transmitter is capable of transmitting light in a second direction towards the second light receiver wherein the second direction is different from the first direction;
   wherein the step of providing the leadframe comprises:
      providing the first one of the plurality of leads opposite the third one of the plurality of leads and adjacent to the fourth one of the plurality of leads; and
      providing the second one of the plurality of leads opposite the fourth one of the plurality of leads and adjacent to the third one of the plurality of leads.

* * * * *